(12) United States Patent
Okada

(10) Patent No.: US 8,530,813 B2
(45) Date of Patent: Sep. 10, 2013

(54) IMAGE DETECTING DEVICE

(75) Inventor: Yoshihiro Okada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 805 days.

(21) Appl. No.: 12/674,438

(22) PCT Filed: Jun. 18, 2008

(86) PCT No.: PCT/JP2008/061129
§ 371 (c)(1),
(2), (4) Date: Apr. 28, 2010

(87) PCT Pub. No.: WO2009/025120
PCT Pub. Date: Feb. 26, 2009

(65) Prior Publication Data
US 2010/0276604 A1  Nov. 4, 2010

(30) Foreign Application Priority Data

Aug. 23, 2007 (JP) .................................. 2007-216980

(51) Int. Cl.
*G01J 1/44* (2006.01)
*H01L 27/00* (2006.01)
(52) U.S. Cl.
USPC ............... 250/208.1; 250/370.09; 250/214 R; 257/173; 257/72

(58) Field of Classification Search
USPC ............. 250/208.1, 370.09, 214 R; 257/173, 257/72, 292
See application file for complete search history.

(56) References Cited

U.S. PATENT DOCUMENTS

| 5,371,351 A | 12/1994 | Van Berkel |
| 6,696,701 B2 * | 2/2004 | Hector et al. .................... 257/72 |
| 2007/0281430 A1 * | 12/2007 | Hirabayashi et al. ......... 438/297 |

FOREIGN PATENT DOCUMENTS

| JP | 6-232382 A | 8/1994 |
| JP | 10-177186 A | 6/1998 |
| JP | 2004-311593 A | 11/2004 |
| JP | 2005-260263 A | 9/2005 |

* cited by examiner

*Primary Examiner* — David Porta
*Assistant Examiner* — Yara Green
(74) *Attorney, Agent, or Firm* — SOLARIS Intellectual Property Group, PLLC

(57) ABSTRACT

Static electricity generated in each data line 3 at the time of manufacturing a TFT active matrix substrate 10 is discharged to a common line 110 through a bidirectional diode 30A. Since the bidirectional diode 30A is configured to have a first allowable level higher than a second allowable level of a protection circuit 112, a leak current that are generated in each data line 3 when being driven is discharged to common lines 111A, 111B through the protection circuit 112.

10 Claims, 16 Drawing Sheets

1. TFT ARRAY SUBSTRATE MANUFACTURE

2. FIRST DIVISION

3. SENSOR LAYER FORMATION
4. UPPER ELECTRODE FORMATION
5. SEALING STEP

6. SECOND DIVISION

7. TCP MOUNTING
8. CIRCUIT MOUNTING

IMAGE DETECTING DEVICE

TECHNICAL FIELD

The present invention relates to an image detecting device, and more particularly relates to an image detecting device at which protection line is provided for discharging static electricity generated at the time of manufacturing, and that uses a substrate for detecting an image.

RELATED ART

In recent years, radiographic image detecting devices have been realized with flat panel detectors (FPDs) or the like, in which an X-ray-sensitive layer is disposed on a thin film transistor (TFT) active matrix substrate, and which can be directly converted X-ray information to digital data. These FPDs have advantages over conventional imaging plates in that images can be checked immediately and even video images can be checked, and are rapidly becoming widely used.

With radiographic image detecting devices of this type, detecting X-ray images of sizes onto which the human body is projected is important, and therefore substrates of large sizes, exceeding 30×30 cm, are required. However, substrates of these large sizes are difficult to manufacture from silicon substrates. Therefore, currently, TFT active matrix substrates formed on thin plates of glass are mainly used.

TFT active matrix substrates are employed as driving substrates of liquid crystal displays (LCDs), and are technologically and economically stable. Therefore, TFT array substrates for image detecting devices are principally manufactured in TFT fabrication lines for LCDs, for reasons of cost.

In FIG. 11, a circuit diagram of a TFT active matrix substrate 10' of a conventional image detecting device is illustrated.

As illustrated in FIG. 11, the TFT active matrix substrate 10' is configured by numerous pixels being arrayed two-dimensionally. Each pixel is configured to include a charge collection electrode 11', which collects charge generated by an unillustrated image sensor portion, a charge accumulation capacitance 5', which accumulates detected charge signals, and a thin film transistor (hereinafter referred to as a TFT switch) 4', for reading out the charge accumulated in the charge accumulation capacitance 5'. A plural number of scan lines (gate lines) 101' and a plural number of data lines 3' are provided on the TFT active matrix substrate 10'. The scan lines 101' are for turning the TFT switches 4' on and off, and the data lines 3' are for reading out the charges accumulated in the charge accumulation capacitances 5'. One electrode of each charge accumulation capacitance 5' is connected to ground via unillustrated line and is set to ground level. In FIG. 11, the one electrode of the charge accumulation capacitance 5' is illustrated as being connected to ground.

Each data line 3' and each scan line 101' at the TFT active matrix substrate 10' is connected to a common line 110' via a respective bidirectional diode 30' for circuit protection, in order to prevent electrostatic damage at the time of manufacturing.

In FIG. 12, an example of configuration of a single diode 31' that configures the conventional bidirectional diode 30' is illustrated.

In a TFT active matrix substrate that uses amorphous silicon TFTs, as illustrated in FIG. 12, the diode 31' may be easily configured by connecting the gate electrode of a TFT switch with the drain electrode.

FIG. 13 is concerned with a single TFT element of the TFT active matrix substrate 10' illustrated in FIG. 11, and illustrates the same in an equivalent circuit.

As illustrated in FIG. 13, at each TFT element of the TFT active matrix substrate 10', the connection between the gate electrode and data electrode of the TFT switch 4' is equivalent to connection by the bidirectional diode 30', which is configured by two of the diodes 31' being connected in parallel with the anode of each being connected to the cathode of the other. Therefore, if one of the electrode potentials rises, charge flows to the other, and rises in potential may be prevented.

Next, a problem with static electricity, when using a TFT manufacturing line for LCDs to manufacture this type of TFT active matrix substrate, is described with reference to FIG. 14A to FIG. 14E.

The size of substrates, that may be manufactured by a TFT manufacturing line for LCDs, depend on the size of devices in the manufacturing line, and is a characteristic size of the line. Currently, it is generally possible to manufacture large-scale substrates of around 1 metre square.

When a TFT manufacturing line for LCDs that is capable of manufacturing these large-scale substrates is used, a single TFT array cell 10A' for an FPD or a TFT array substrate 10B' in which plural sheets are formed (see FIG. 14A) is manufactured.

The manufactured TFT array substrate 10B' is divided in a first division step, and the TFT array cells 10A' are cut apart (see FIG. 14B). In a sensor layer formation step which is performed thereafter, because the layer is mainly formed by a vacuum deposition or chemical vapor deposition (CVD) method or the like, equipment prices rise in proportion to the size of the substrate. Therefore, it is desirable for the TFT array cell 10A' to be cut apart from the TFT array substrate 10B' to a minimum required size in the first division step, and a chamber size of the manufacturing equipment to be smaller.

Then, formation of the sensor layer and formation of upper electrodes are performed on the cut apart TFT array cell 10A', and after these formations are complete, a sealing step that covers the sensor layer and upper electrodes with a glass substrate or resin or the like is performed (see FIG. 14C).

Then, after the sealing step, a second division is applied to the TFT array cell 10A'. Until the second division step, in order to protect gate insulation films of the TFT switches 4', a short-circuit ring 120' is provided in the TFT array cell 10A'. In the second division, the short-circuit ring 120' is separated from the TFT array cell 10A' in order to perform TCP mounting in a subsequent step, and the electrodes are electrically and physically separated (see FIG. 14D).

Then, mounting of gate drivers and amplifier ICs is performed on the TFT array cell 10A' from which the short-circuit ring 120' has been separated (TCP mounting being the mounting of ICs mounted on a tape carrier package). Finally, circuit substrates (a gate driving substrate 104', a signal detecting circuit substrate 105' and the like) are mounted, and the TFT active matrix substrate 10' is completed (see FIG. 14E).

Note that, the short-circuit ring 120' is a line that connects electrodes at two ends of an insulation film for preventing applications of voltage to the insulation film.

Namely, in the above-described case of the TFT array cell 10A', end portions of the data lines and scan lines are connected with metal line that is disposed at the peripheral portion of the array. Therefore, even if charge is applied to some signal line by static electricity or the like and a potential rises, the charge immediately flows out into the short-circuit ring 120'. Thus, applications of voltage to the insulation film are prevented.

In contrast, if there is no short-circuit ring 120' at the TFT array cell 10A', strong electric fields are often applied to the insulation film by static electricity, as a result of which shifts in characteristics of the TFTs, insulation damage (leak defects) and the like occur.

Thus, by providing the short-circuit ring 120' at the TFT array substrate 10B', manufacturing productivity of the TFT array cells 10A' can be kept high, and therefore manufacturing costs can be kept down.

However, as illustrated in FIG. 14E, input and output terminals of the TFT array cell 10A' are in an electrically completely separated state, from after the second division until the TCP mounting and circuit mounting. Therefore, the same as when there is no short-circuit ring 120', occurrences of shifts in characteristics, insulation damage defects and the like are a concern.

In order to prevent this, as illustrated in FIG. 11, it is common for each bidirectional diode 30' for protection to be disposed between the signal line and the common line 110' disposed at the peripheral portion of the active matrix array. Therefore, though not to the same extent as with the short-circuit ring 120', charges can flow into neighboring lines, and occurrences of static electricity defects due to voltages being applied to the insulation film by static electricity, such as shifts in characteristics, insulation damage defects and the like, can be suppressed.

Now, as a related technology, Patent Reference 1 discloses a configuration in which, in a case of using a TFT active matrix substrate as an LCD driving substrate, common line is formed to surround a display portion and bidirectional diodes for protection, are formed between the common line and respective signal lines. When static electricity impinges on the signal lines, the static electricity is dispersed into the common line by the bidirectional diodes, and thus the TFTs are protected.

Patent Reference 1: Japanese Patent Application Laid-Open (JP-A) No. H10-177186

DISCLOSURE OF THE INVENTION

Problem to be Solved by the Invention

Now, in a voltage control-type device such as the LCD illustrated in Patent Reference 1, there is no problem at all for a product to which the same is applied when the common line 110' is formed as described above and the bidirectional diodes 30' are introduced between the common line 110' and the data lines 3' and scan lines 101'. This is because, for example, in an LCD, there is a voltage control-type device that controls respective voltages to be applied to the data lines 3' and the scan lines 101' of the TFT active matrix substrate in accordance with an image that is to be displayed.

That is, when a potential difference arises between the signal lines during actual driving, a current flows through the bidirectional diodes 30'. However, because resistance values of the diodes 31' are rather higher than those of the signal lines, potentials of the signal lines are maintained. Therefore, in an LCD in which driving conditions are determined by voltages, there are no malfunctions at all.

On the other hand, in an FPD, while no problems are caused for driving of the scan lines 101', similarly to the LCD, the data lines 3' are signal detecting circuits (amplifier circuits) that detect electric charge amounts. Therefore, there is a problem in that signal values of the data lines that are detected at a signal detecting circuit change, when a potential difference arises between the signal lines during actual driving and a leak current flows between the data lines. Consequently, there is a problem in that incorrect data information flows into data lines and artifacts (false images) appear.

The present invention has been made in order to solve the problems described above, and an object is to provide an image detecting device that, while preventing occurrences of static electricity defects at the time of manufacturing a substrate, can suppress changes in signal values due to leak currents during driving.

Method of Solving the Problem

In order to achieve the object described above, a first aspect of the present invention is an image detecting device including: a substrate including a plurality of accumulation portions that accumulate charges generated by irradiated electromagnetic waves representing an image which is an object of detection, a plurality of data lines respectively separately connected to the plurality of accumulation portions, a first protection line that protects circuitry from excessive voltage, and a plurality of first protection circuits, respectively separately connected to the plurality of data lines and the first protection line, that allow the current to flow if a potential difference between the data lines and the first protection line is equal to or greater than a predetermined first allowable level; and a detecting circuit, connected to the plurality of data lines, that reads the charges respectively accumulated in the plurality of accumulation portions, and that detects charge amounts to serve as information of pixels configuring the image, including a second protection line that protects circuitry from excessive voltage, and a plurality of second protection circuits, respectively separately connected to the plurality of data lines and the second protection line, that allow the current to flow if a potential difference between the data lines and the second protection line is equal to or greater than a predetermined second allowable level, wherein the plurality of first protection circuits are configured such that the first allowable level is higher than the second allowable level of the second protection circuits.

The substrate of the first aspect of the present invention includes the plural accumulation portions that are irradiated and in which charges generated by the electromagnetic waves representing the image that is the detection object are accumulated, the plural data lines that are respectively individually connected to the plural accumulation portions, the first protection line for protecting circuitry from excessive voltages, and the plural first protection circuits that are respectively individually connected to the plural data lines and the first protection line and through which current flows when a potential difference between the data lines and the first protection line is at or above the predetermined first allowable level.

Therefore, in the substrate of the first aspect of the present invention, static electricity that is generated in the data lines at the time of being manufactured can be discharged through the first protection circuits into the first protection lines. Therefore, occurrences of static electricity defects at the time of substrate manufacturing can be prevented.

Further, the detecting circuit of the first aspect of the present invention is a detecting circuit that is connected to the plural data lines, that draws out the respective charges accumulated in the plural accumulation portions, and that detects the charge amounts as information of the pixels configuring the image. The detecting circuit includes the second protection line for protecting circuitry from excessive voltage, and the plural second protection circuits that are respectively individually connected to the plural data lines and the second protection line and through which current flows when a potential difference between the data lines and the second protection line is at or above the predetermined second allowable level.

In the present invention, the plural first protection circuits are configured such that the first allowable level is higher than the second allowable level of the second protection circuits.

Therefore, according to the first aspect of the present invention, leak currents that are generated in the data lines during driving can be discharged through the second protection circuits to the second protection line. Therefore, changes in signal values due to leak currents during driving can be suppressed.

In a second aspect of the present invention, in the first aspect, each first protection circuit may be a bidirectional diode configured with two diodes connected in parallel with the anode of each connected to the cathode of the other.

Further, in a third aspect of the present invention, in the second aspect, each diode may be configured by electrically connecting a gate and a drain of a back gate-type field effect transistor, and the image detecting device may further comprise, a voltage application circuit that applies, to the gates of the field effect transistors structuring the plurality of first protection circuits, a voltage that puts the field effect transistors into an off state, when reading the charges accumulated at the accumulation portions.

Further, in a fourth aspect of the present invention, in the third aspect, at the substrate, the plurality of data lines may be provided in parallel and the plurality of scan lines are provided in parallel and intersecting the plurality of data lines, the accumulation portions and the field effect transistors that control reading of accumulated charges from the accumulation portions are respectively provided plurally in a two-dimensional arrangement at intersection portions of the data lines and the scan lines, and the field effect transistors are controlled to on and off states by voltages that are respectively applied to the plurality of scan lines, and the gates of the field effect transistors configuring the plurality of first protection circuits may be connected to any one of the scan lines.

Further, in a fifth aspect of the present invention, in the fourth aspect, the gates of the field effect transistors that configure the plurality of first protection circuits is preferable to be connected to the scan line disposed furthest to one end of the plurality of scan lines provided in parallel.

Further, in a sixth aspect of the present invention, in the fourth aspect, the plurality of scan lines may be each connected to the first protection line by a diode or a member with a resistance value equal to or greater than a predetermined value.

Further, in a seventh aspect of the present invention, in the third aspect, the substrate may be a TFT active matrix substrate formed by a plurality of layers being layered, and the back gate electrodes of the field effect transistors of the substrate may be disposed at a layer above a semiconductor layer to oppose the gate electrodes, through insulation films.

Further, in an eighth aspect of the present invention, in the seventh aspect, the back gate electrodes of the field effect transistors of the substrate may be formed by the same members as the data lines.

Further, in an ninth aspect of the present invention, in the seventh aspect, the back gate electrodes may be formed in the same layer as a layer that forms charge collection electrodes that collect charges generated at the accumulation portions.

Further, in an tenth aspect of the present invention, in the fourth aspect, the substrate may further include the first protection line for the scan lines, which is connected to the scan lines, the first protection line for the data lines, which is connected to the data lines, and a third protection circuit that connects the first protection line for the scan lines with the first protection line for the data lines.

Effect of the Invention

Thus, according to the present invention, there are excellent effects in that, while occurrences of static electricity defects at the time of manufacturing the substrate are prevented, changes in signal values due to leak currents during driving can be suppressed.

BEST MODE OF IMPLEMENTING THE INVENTION

Herebelow, exemplary embodiments of the present invention will be described while referring to the attached drawings. Below, a case is described in which the present invention is applied to a radiographic image detecting device 100 in which an X-ray sensitive layer is formed on a TFT active matrix substrate, and X-ray information is directly converted to digital data.

Figure 1:
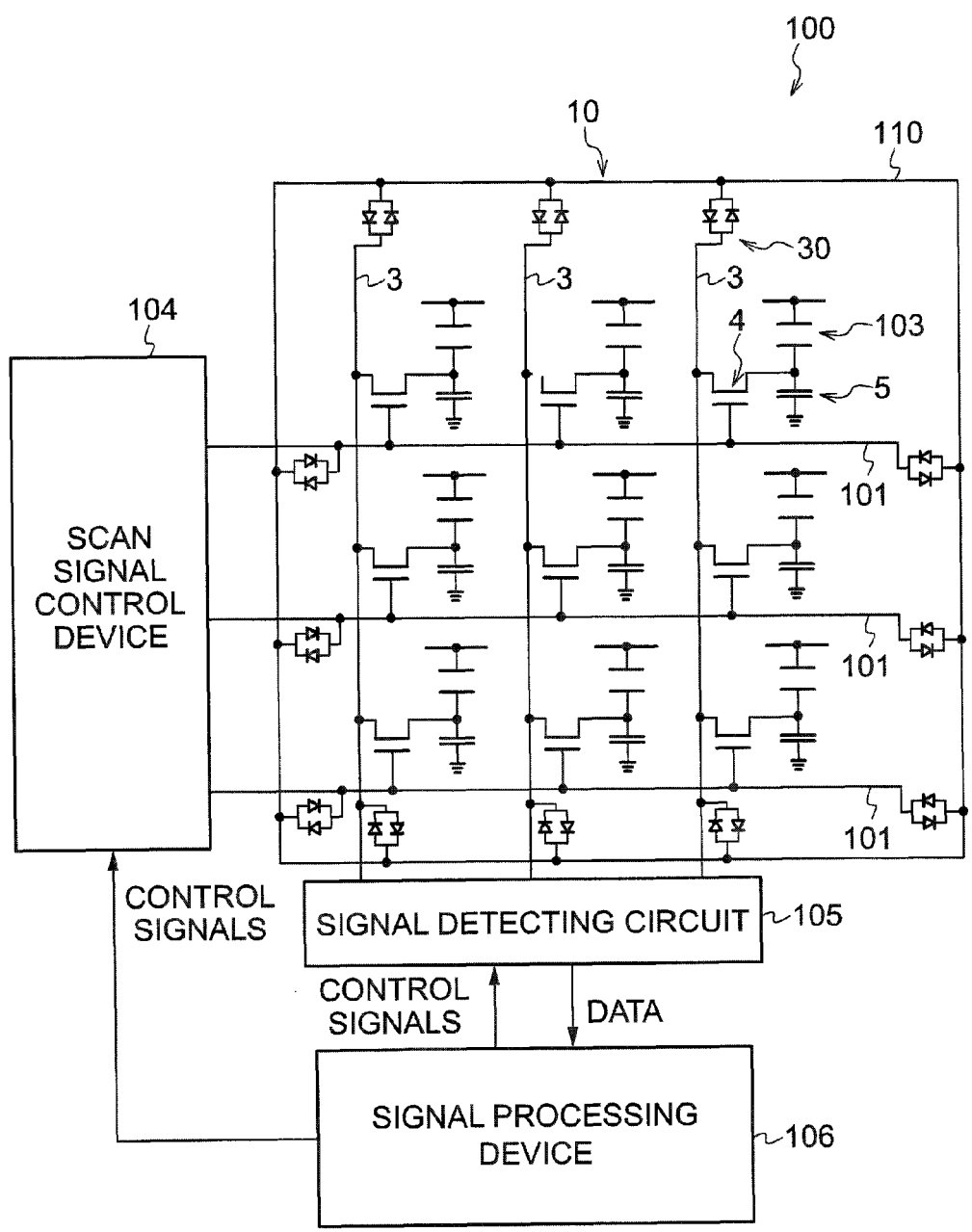
FIG. 1 is a structural diagram illustrating overall configuration of a radiographic image detecting device according to an exemplary embodiment.

In FIG. 1, overall configuration of the radiographic image detecting device 100 according to the exemplary embodiment of the present invention is illustrated.

As illustrated in FIG. 1, the radiographic image detecting device 100 according to the exemplary embodiment of the present invention is equipped with a TFT active matrix substrate, which corresponds to the substrate of the present invention.

At the TFT active matrix substrate 10, pixels each configured with an image sensor portion 103, a charge accumulation capacitance 5 and a TFT switch 4 are numerously provided in a two-dimensional arrangement. The image sensor portion 103 is configured with a later-described bias electrode, a semiconductor film and a charge collection electrode. The charge accumulation capacitance 5 accumulates charge signals detected by the sensor portion 103 and corresponds to an accumulation portion of the present invention. The TFT switch 4 reads out charge that has been accumulated in the charge accumulation capacitance 5.

In the TFT active matrix substrate 10, plural scan lines 101 and plural data lines 3 are provided. The scan lines 101 are for turning the TFT switches 4 on and off. The data lines 3 read out the charges accumulated in the charge accumulation capacitances 5. One electrode of each charge accumulation capacitance 5 is connected to ground through unillustrated line, and is set to ground level. Herein, in FIG. 1 and the later-described FIG. 4, the one electrode of the charge accumulation capacitance 5 is shown as being connected to ground.

At the TFT active matrix substrate 10, a common line 110, which corresponds to the first protection line of the present invention, is provided at a peripheral portion of the substrate so as to surround all of the two-dimensionally provided pixels. The respective scan lines 101 and data lines 3 are connected, at intersection portions of the respective wires, with the common line 110 by respective bidirectional diodes 30, which correspond to the first protection circuits of the present invention, for protection.

In the present exemplary embodiment, the scan lines 101 and the data lines 3 are respectively connected to a single common line 110. However, for example, a configuration as follows is possible. Namely, a configuration is possible in which two common lines 110 are provided, the scan lines 101 are respectively connected to a different common line 110 from the data lines 3, and a high resistance element (protection circuit) such as a bidirectional diode or the like, is interposed between the common line 110 that is connected to the scan lines 101 (a scan side common line), and the common line 110 that is connected to the data lines 3 (a data side common line) to connect the scan side common line and data side common line. In this case, because the high resistance element is interposed, flows of current flowing through the scan line side common line into the data line side common line may be suppressed. Further, a configuration is possible in which the scan side common line and the data side common line are respectively separately connected to a common power supply (GND). If high voltages are applied to the scan lines 101 and current flowing through the protection circuits into the common line are large, because the scan side common line and the data side common line are separated, flows of current flowing through the scan side common line into the data line side common line can be suppressed.

A signal detecting circuit 105, which corresponds to the detecting circuit of the present invention, is connected to the data lines 3. The signal detecting circuit 105 detects charges flowing from the data lines 3 as electronic signals. A scan signal control device 104, which serves as the voltage application circuit of the present invention, is connected to the scan lines 101. The scan signal control device 104 outputs control signals to the respective scan lines for turning the TFT switches 4 on and off.

For each data line 3, the signal detecting circuit 105 incorporates an amplification circuit 107 (see FIG. 4) that amplifies the voltage level of an inputted electronic signal. The signal detecting circuit 105 amplifies the electronic signals inputted by the data lines 3 and detects the voltage levels of the electronic signals, and thus detects charge amounts accumulated in the charge accumulation capacitances 5 to serve as information of pixels configuring an image.

A signal processing device 106 is connected to the signal detecting circuit 105 and the scan signal control device 104. The signal processing device 106 applies predetermined processing to the electrical signals detected at the signal detecting circuit 105, outputs control signals representing signal detection timings to the signal detecting circuit 105, and outputs control signals representing scan signal output timings to the scan signal control device 104.

Figure 2:
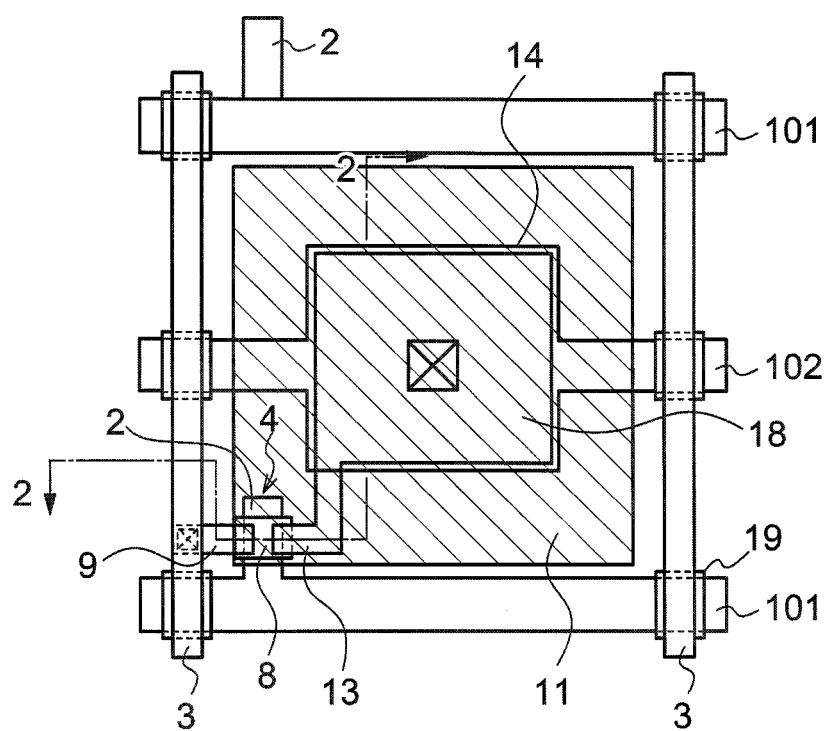
FIG. 2 is a plan diagram illustrating a configuration of a single pixel unit of a TFT active matrix substrate according to the exemplary embodiment.
Figure 3:
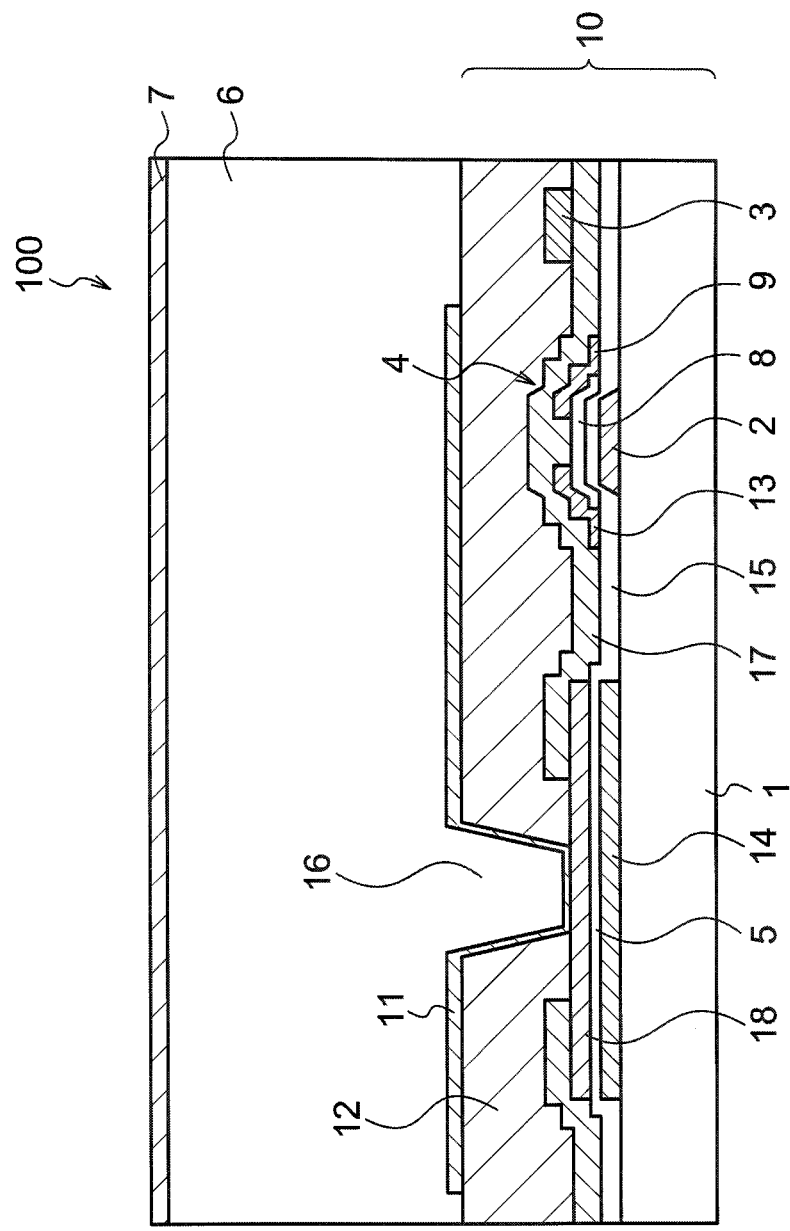
FIG. 3 is a sectional diagram cut along line 2-2 in FIG. 2, according to the exemplary embodiment.

Next, the TFT active matrix substrate 10 according to the present exemplary embodiment is described in more detail with reference to FIG. 2 and FIG. 3. In FIG. 2, a plan diagram illustrating the configuration of a single pixel unit of the TFT active matrix substrate according to the present exemplary embodiment is shown. In FIG. 3, a sectional diagram cut along line 2-2 of FIG. 2 is illustrated.

As illustrated in FIG. 3, a semiconductor film 6 with electromagnetic wave conductivity and a bias electrode 7 connected to an unillustrated high voltage power supply, are formed in this order on the TFT active matrix substrate 10 according to the present exemplary embodiment. When electromagnetic waves, such as X-rays or the like, are irradiated, the semiconductor film 6 generates charges (electrons and holes) thereinside. Namely, the semiconductor film 6 features conductivity for electromagnetic waves, and is for converting image information in the X-rays to charge information. The semiconductor film 6 is formed of, for example, a-Se (amorphous selenium), of which selenium is the principal component. Here, the meaning of the term principal component is the inclusion of a content of at least 50%.

Next, configuration of layers of the TFT active matrix substrate 10 according to the present exemplary embodiment is described in more detail.

The TFT active matrix substrate 10 includes a glass substrate 1, gate electrodes 2, accumulation capacitance lower electrodes 14, gate insulation films 15, semiconductor layers 8, source electrodes 9, drain electrodes 13, accumulation capacitance upper electrodes 18, an insulation protection film 17, the data lines 3, an interlayer insulation film 12 and charge collection electrodes 11. As illustrated in FIG. 2, the scan lines 101 are connected to the gate electrodes 2. The gate electrodes 2 and the scan lines 101 are formed by the same metal layer. Furthermore, accumulation capacitance lines 102 are connected to the accumulation capacitance lower electrodes 14. The accumulation capacitance lower electrodes 14 and the accumulation capacitance lines 102 are formed by the same metal layer.

The TFT switches 4 are configured by the gate electrodes 2, the gate insulation films 15, the source electrodes 9, the drain electrodes 13, the semiconductor layers 8, and suchlike. The charge accumulation capacitances 5 are configured by the accumulation capacitance lower electrodes 14, the gate insulation films 15 and the accumulation capacitance upper electrodes 18, or suchlike.

The glass substrate 1 is a support substrate. As the glass substrate 1, for example, a non-alkaline glass substrate may be used (for example, #1737 manufactured by Corning Inc.). As illustrated in FIG. 1, the scan lines 101 and the data lines 3 are electrode lines arranged in a grid pattern, and the TFT switches 4 are formed, as illustrated in FIG. 2, at intersections thereof. The TFT switches 4 are switching elements, the source electrodes 9 thereof are connected to the data lines 3 through contact holes, and the drain electrodes 13 are connected to the accumulation capacitance upper electrodes 18.

The gate insulation films 15 are formed of $SiN_X$, $SiO_X$ or the like. The gate insulation films 15 are provided to cover the gate electrodes 2, the scan lines 101, the accumulation capacitance lower electrodes 14 and the accumulation capacitance lines 102. Portions of the gate insulation films 15 over the gate electrodes 2 act as gate insulation films of the TFT switches 4, and portions disposed over the accumulation capacitance lower electrodes 14 act as dielectric films of the charge accumulation capacitances 5. Namely, the charge accumulation capacitances 5 are formed by regions in which the accumulation capacitance lower electrodes 14, which are formed in the same layer as the gate electrodes 2, and the accumulation capacitance upper electrodes 18 are superposed.

The semiconductor layers 8 are the channels of the TFT switches 4, and are current paths linking the source electrodes 9 connected to the data lines 3 with the drain electrodes 13 connected to the accumulation capacitance upper electrodes 18.

The insulation protection film 17 is formed over substantially the whole area (substantially the whole region) of the region of the glass substrate 1 at which pixels are provided. Thus, the insulation protection film 17 protects the drain electrodes 13 and the source electrodes 9, and enables electrical insulative separation. The insulation protection film 17 includes contact holes 16 at positions disposed over portions opposing the accumulation capacitance lower electrodes 14.

The charge collection electrodes 11 are formed of a non-crystalline transparent conductive oxide film. The charge collection electrodes 11 are formed to fill in the contact holes 16, and are layered over the source electrodes 9 and the drain electrodes 13, and the accumulation capacitance upper electrodes 18. The charge collection electrodes 11 and the semiconductor film 6 are electrically in conductive communication, and charges generated in the semiconductor film 6 can be collected at the charge collection electrodes 11.

The interlayer insulation film 12 is formed of an acrylic resin featuring photosensitivity, and enables electrical insulative separation of the TFT switches 4. The contact holes 16 penetrate through the interlayer insulation film 12, and the charge collection electrodes 11 are connected to the accumulation capacitance upper electrodes 18 through the contact holes 16.

The gate electrodes 2, the scan lines 101, the accumulation capacitance lower electrodes 14 and the accumulation capacitance lines 102 are provided on the glass substrate 1. The semiconductor layers 8 are formed above the gate electrodes 2, with the gate insulation films 15 therebetween. The source electrodes 9 and the drain electrodes 13 are formed on the semiconductor layers 8. The accumulation capacitance upper electrodes 18 are layered above the layers that configure the charge accumulation capacitance 5. Further, the insulation protection film 17 is disposed above the accumulation capacitance upper electrodes 18 and the source electrodes 9 and the drain electrodes 13.

The data lines 3 are disposed over the insulation protection film 17. The interlayer insulation film 12 is provided over the insulation protection film 17 and the data lines 3. The charge collection electrodes 11 are provided at a top layer of the interlayer insulation film 12, namely, the uppermost layer of the TFT active matrix substrate 10. The charge collection electrodes 11 and the TFT switches 4 are connected through the accumulation capacitance upper electrodes 18 and the drain electrodes 13.

An unillustrated high-voltage power supply is connected between the bias electrode 7 and the accumulation capacitance lower electrodes 14.

Next, principles of operation of the radiographic image detecting device 100 with the above-described configuration are described.

In a state in which a voltage is applied between the bias electrode 7 and the accumulation capacitance lower electrodes 14, when X-rays are irradiated at the semiconductor film 6, charges (electron-hole pairs) are generated within the semiconductor film 6. The semiconductor film 6 and the charge accumulation capacitances 5 are configured to be electrically connected in series. Therefore, electrons generated in the semiconductor film 6 migrate to a positive (plus) electrode side and holes migrate to a negative (minus) electrode side. As a result, charges are accumulated at the charge accumulation capacitances 5.

The charges accumulated at the charge accumulation capacitances 5 can be read out through the data lines 3 to the exterior by the TFT switches 4 being turned on by input signals to the scan lines 101.

The scan lines 101 and the data lines 3, and the TFT switches 4 and the charge accumulation capacitances 5, are all provided in an XY matrix arrangement. Therefore, X-ray image information in two dimensions can be obtained by sequentially scanning signals that are input to the scan lines 101, and by detecting the signals from the data lines 3 at each data line 3.

Now, with the TFT active matrix substrate 10 according to the present exemplary embodiment, in order to prevent electrostatic damage at a time of FPD manufacture, the scan lines 101 and the data lines 3 are respectively connected to the common line 110 through the bidirectional diodes 30. Thus, when high voltages are applied to the scan lines 101 and the data lines 3 by static electricity or the like, charges are released to the common line 110 through the bidirectional diodes 30. Thus, applications of high voltages to insulation films are prevented.

However, at the data lines 3, during actual driving, because of the static electricity, or charge being accumulated in the charge accumulation capacitances 5 beyond anticipated levels, potential differences may arise between the signal lines, leak currents may flow between the data lines 3, and signal values of the data lines 3 that are detected at the signal detecting circuit 105 may change.

Figure 4:
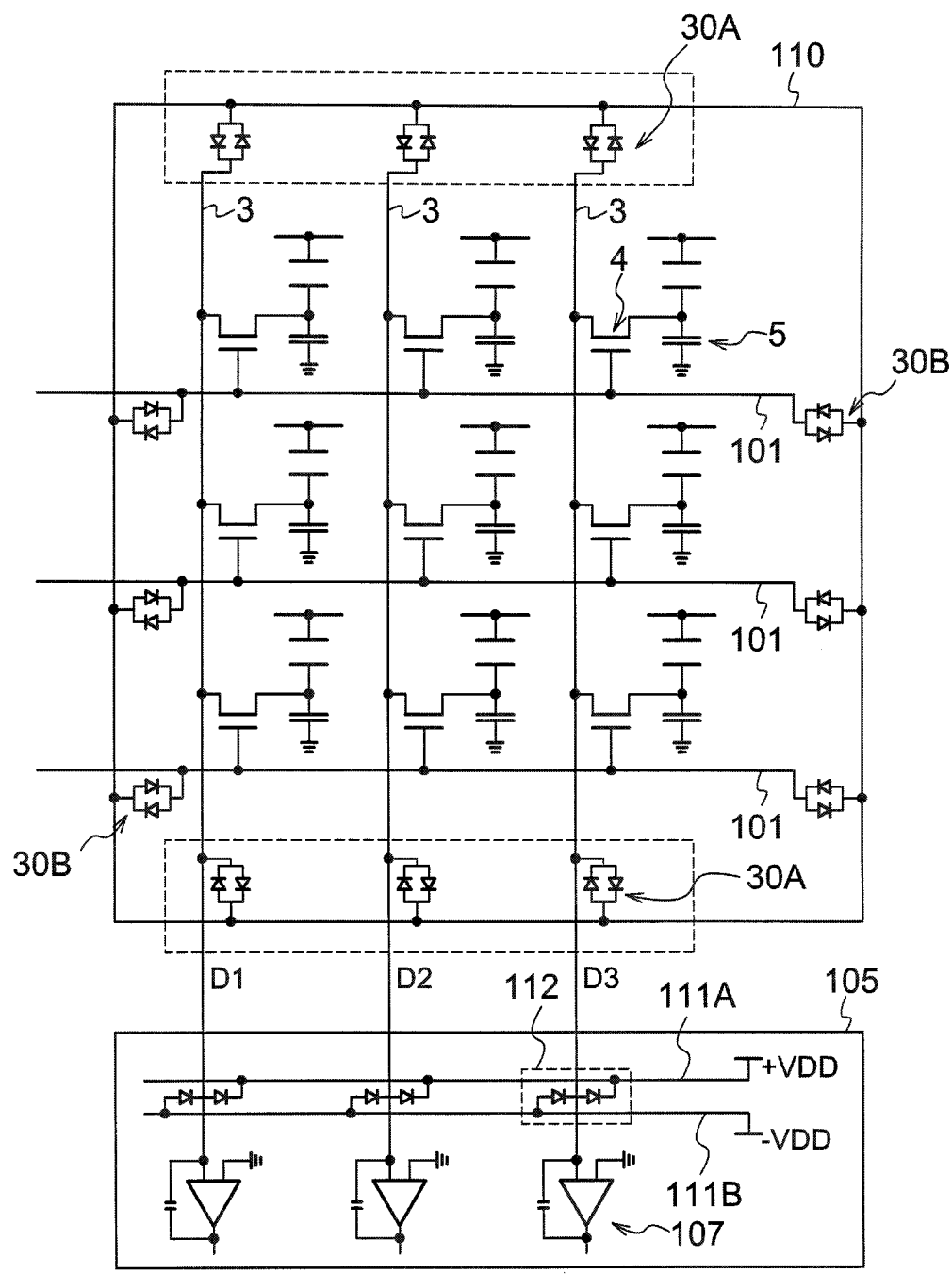
FIG. 4 is a structural diagram illustrating overall configuration of the TFT active matrix substrate according to the exemplary embodiment.

Accordingly, in the TFT active matrix substrate 10 according to the present exemplary embodiment, leak currents between the data lines 3 are made less likely to flow by alteration of the configuration of the bidirectional diodes 30 provided at the data lines 3, which are shown surrounded by a broken line in FIG. 4.

Two common lines 111A and 111B, which serve as lines for discharging currents and protecting circuits, are provided inside the signal detecting circuit 105. A voltage +VDD is applied to the common line 111A and a voltage −VDD is applied to the common line 111B. In order to prevent electrostatic damage, each of the data lines 3 is connected to the common lines 111A and 111B by a respective protection circuit 112 (two diodes in the present exemplary embodiment). The common lines 111A and 111B correspond to the second protection line of the present invention, and the protection circuits 112 correspond to the second protection circuits of the present invention.

Hereinafter, when distinguishing between the bidirectional diodes 30 provided at the data lines 3 and the bidirectional diodes 30 provided at the scan lines 101, the bidirectional diodes 30 at the data lines 3 are referred to as bidirectional diodes 30A and the bidirectional diodes 30 at the scan lines 101 are referred to as bidirectional diodes 30B.

Below, configurations of the bidirectional diode 30A and the bidirectional diode 30B are contrastingly described.

Figure 5A:
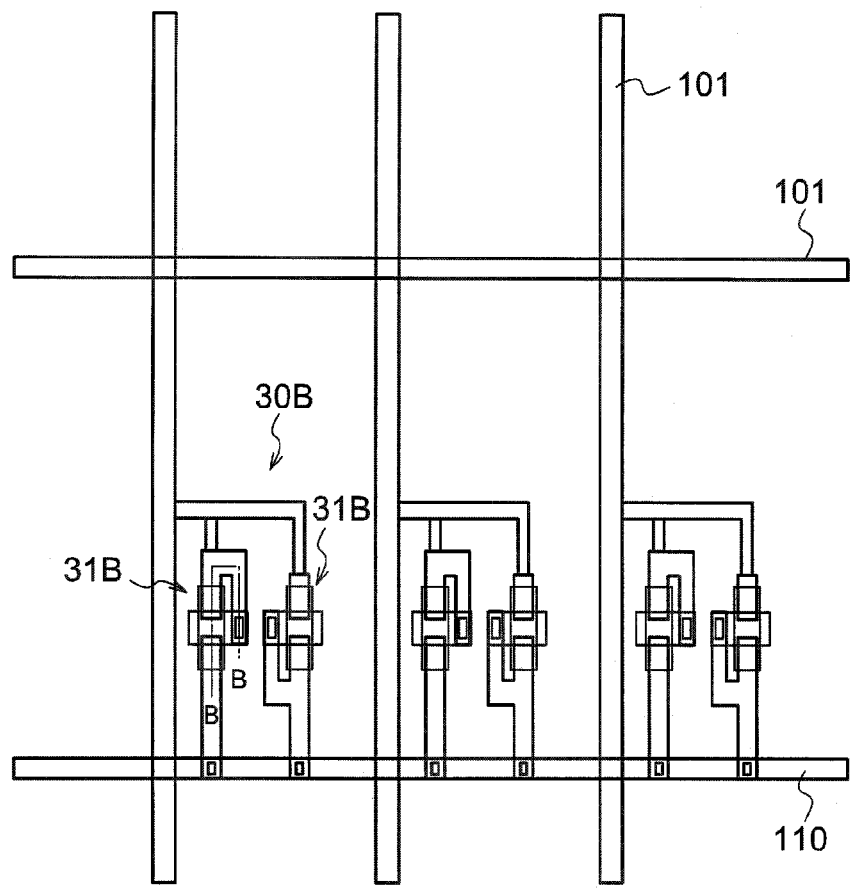
FIG. 5A is a plan diagram illustrating the configuration of a bidirectional diode 30B according to the exemplary embodiment.
Figure 5B:
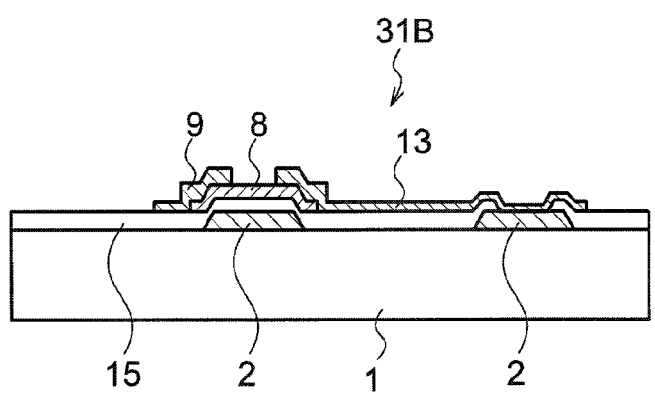
FIG. 5B is a sectional diagram illustrating a section at line B-B of one of diodes 31B that configure the bidirectional diode 30B illustrated in FIG. 5A.

The configuration of the bidirectional diode 30B is illustrated in FIG. 5A and FIG. 5B. FIG. 5A is a plan diagram illustrating configuration of the bidirectional diode 30B, and FIG. 5B is a sectional diagram illustrating a section at line B-B of one of diodes 31B that configure the bidirectional diode 30B illustrated in FIG. 5A.

As illustrated in FIG. 5B, the diode 31B is formed by sequentially layering the gate electrode 2, the gate insulation film 15 and the semiconductor layer 8 on the glass substrate 1. Further, the source electrode 9 and the drain electrode 13 are formed on the semiconductor layer 8, and the drain electrode 13 is connected with the gate electrode 2.

Figure 12:
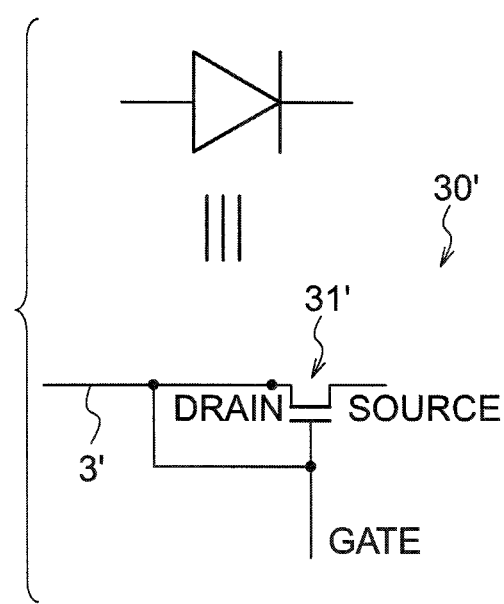
FIG. 12 is a structural diagram illustrating the configuration of one of diodes that configure a conventional bidirectional diode.
Figure 13:
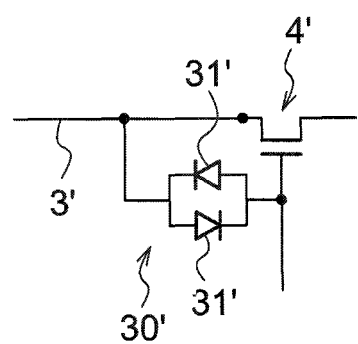
FIG. 13 is a circuit diagram illustrating an equivalent circuit concerned with a single TFT element of the conventional TFT active matrix substrate.
Figure 14A:
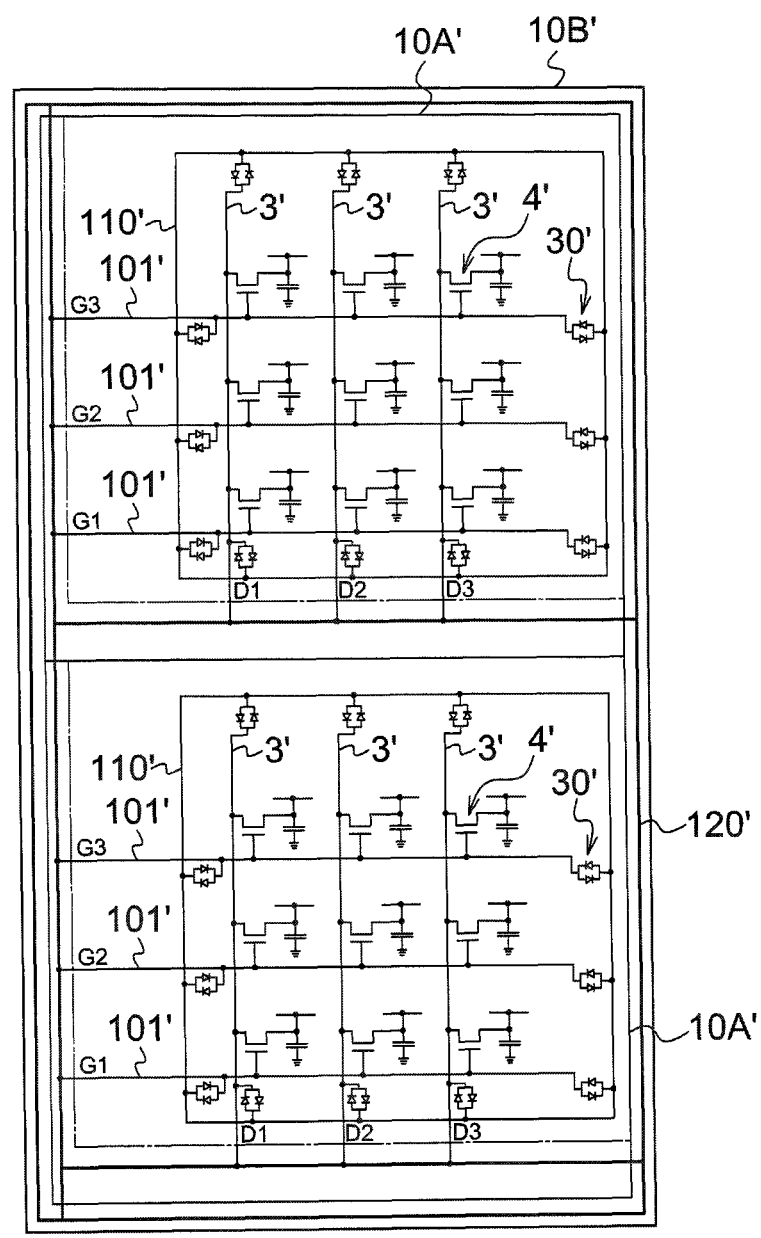
FIG. 14A is a schematic diagram illustrating a first manufacturing stage of a TFT active matrix substrate.
Figure 14B:
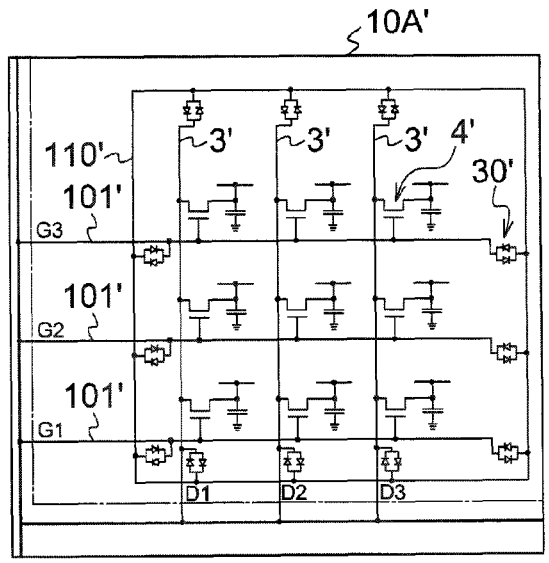
FIG. 14B is a schematic diagram illustrating a second manufacturing stage of a TFT active matrix substrate.
Figure 14C:
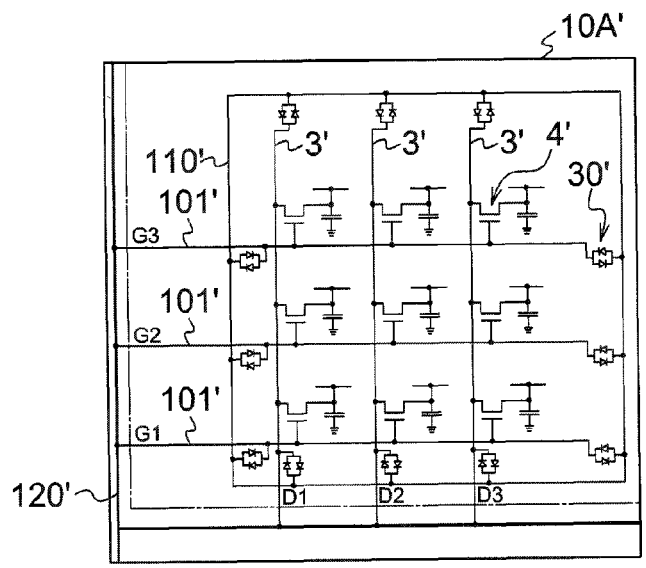
FIG. 14C is a schematic diagram illustrating a third manufacturing stage of a TFT active matrix substrate.
Figure 14D:
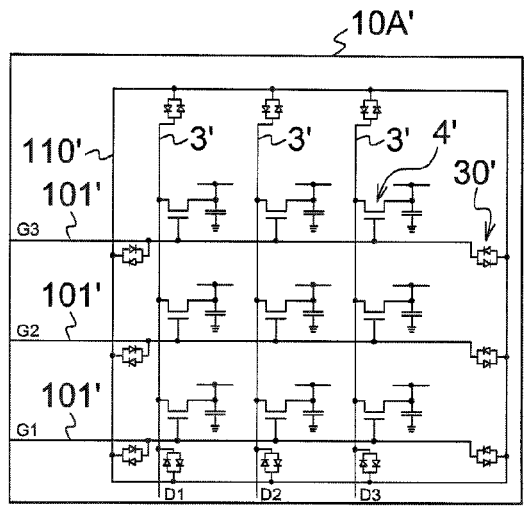
FIG. 14D is a schematic diagram illustrating a fourth manufacturing stage of a TFT active matrix substrate.
Figure 14E:
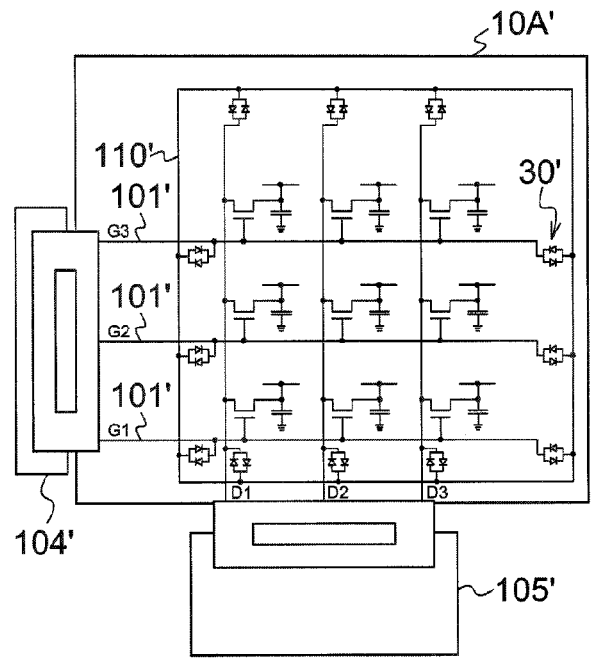
FIG. 14E is a schematic diagram illustrating a fifth manufacturing stage of a TFT active matrix substrate.

Namely, the bidirectional diode 30B has a configuration in which the gate electrode and drain electrode of a TFT are simply connected as illustrated in FIG. 12, which is described in the Background Art section.

Figure 8:
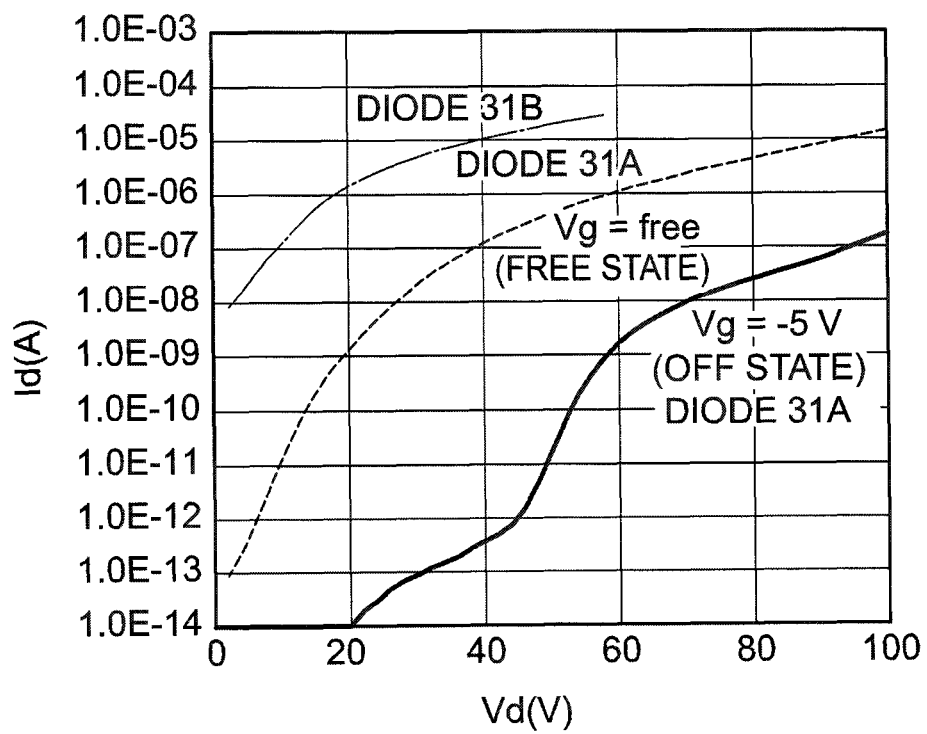
FIG. 8 is a graph illustrating characteristics of the diodes according to the exemplary embodiment.

In FIG. 8, a diode characteristic of the diode 31B according to the present exemplary embodiment is shown by a single-dot chain line.

As illustrated in FIG. 8, with this diode 31B, a leak current of the order of several to tens of nA is produced even close to 0 V (when the potential of a data line is raised even a little). Therefore, for example, if using the diodes 31B at the bidirectional diodes 30A to connect the data lines 3 with the common line 110 is considered, signal charges would leak from the data lines 3 to the common line 110. Because the diodes 31B are arranged bidirectionally, the leaked charges would flow into others of the data lines 3 at which potentials are not high. Levels of the leak currents would vary depending on materials of the layers of the TFTs, manufacturing processes, and design patterns of channel lengths and the like.

Figure 6A:
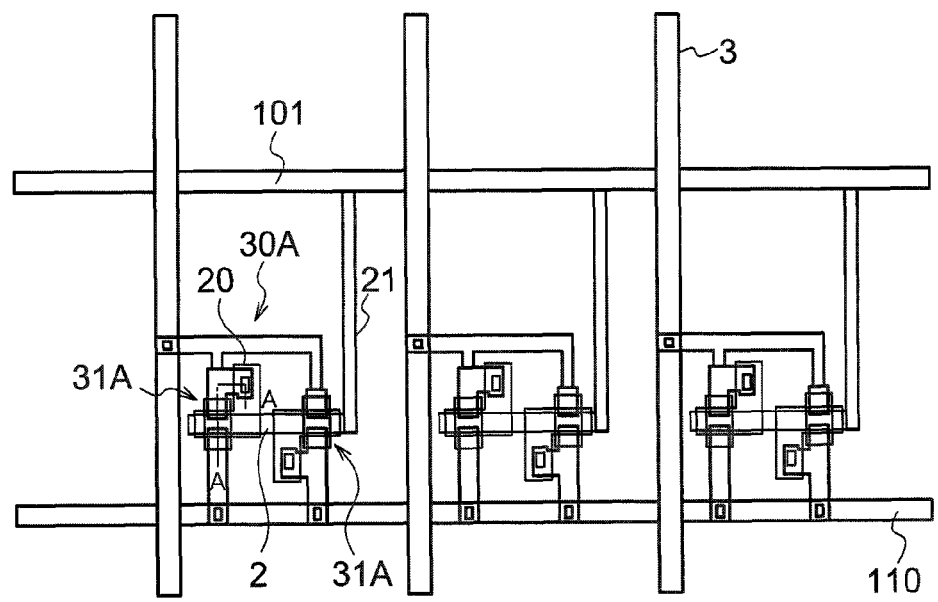
FIG. 6A is a plan diagram illustrating the configuration of a bidirectional diode 30A according to the exemplary embodiment.
Figure 6B:
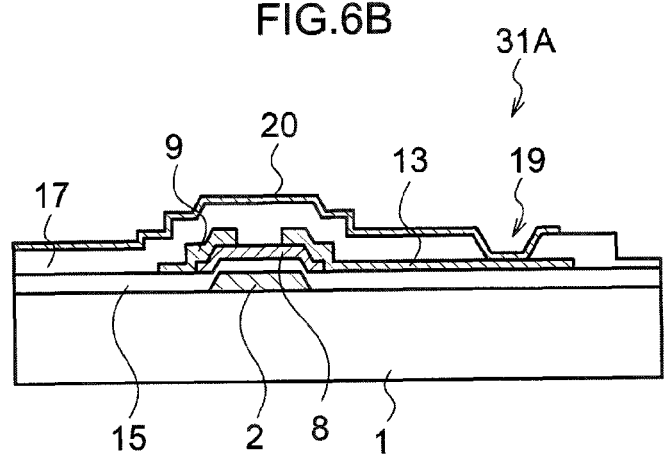
FIG. 6B is a sectional diagram illustrating a section at line A-A of one of diodes 31A that configure the bidirectional diode 30A illustrated in FIG. 6A.

The configuration of the bidirectional diode 30A is illustrated in FIG. 6A and FIG. 6B. Here, FIG. 6A is a plan diagram illustrating the configuration of the bidirectional diode 30A, and FIG. 6B is a sectional diagram illustrating a section at line A-A of one of diodes 31A that configure the bidirectional diode 30A illustrated in FIG. 6A.

As illustrated in FIG. 6B, the diode 31A is formed by sequentially layering the gate electrode 2, the gate insulation film 15 and the semiconductor layer 8 on the glass substrate 1. Further, the source electrode 9 and the drain electrode 13 are formed on the semiconductor layer 8, and the drain electrode 13 is connected with the gate electrode 2. A region between the source electrode and drain electrode of the semiconductor layer functions as the channel portion, and the insulation protection film 17 is formed to cover the channel portion, the source electrode 9 and the drain electrode 13. In an amorphous silicon TFT that employs amorphous silicon for the semiconductor layer, $SiN_x$ formed into a film by CVD is commonly used as a protection insulation film, and is a necessary layer for assuring switching characteristics and reliability of the TFT. Further, a contact hole 19 is formed in the insulation protection film 17. A back gate electrode 20 is formed on the insulation protection film 17 by being layered so as to fill in the contact hole 19 and cover a region corresponding to the gate electrode 2, the semiconductor layer 8, the source electrode 9 and the drain electrode 13. The back gate electrode 20 is connected with the drain electrode 13 through the contact hole 19.

The gate electrode 2 is connected to the adjacent scan line 101 by connection line 21.

Figure 7A:
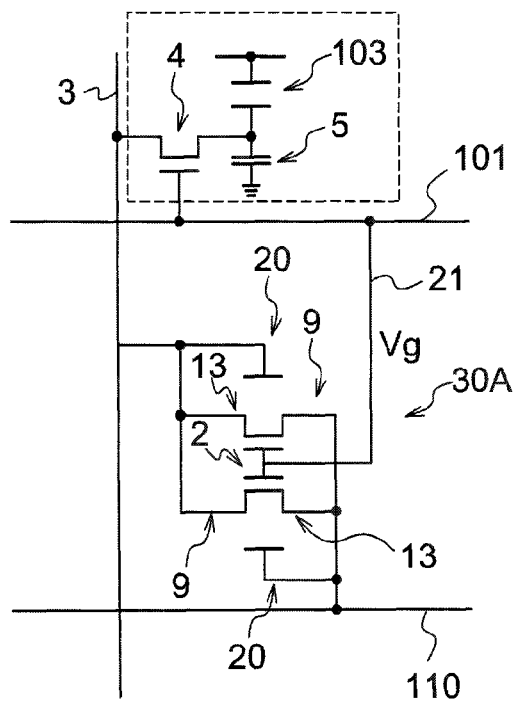
FIG. 7A is a circuit diagram illustrating an equivalent circuit of the bidirectional diode 30A according to the exemplary embodiment.
Figure 7B:
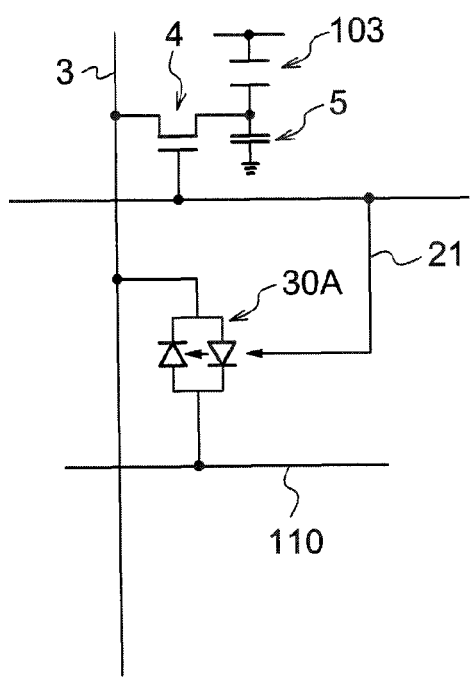
FIG. 7B is a circuit diagram illustrating an equivalent circuit of the bidirectional diode 30A according to the exemplary embodiment.

In FIG. 7A and FIG. 7B, equivalent circuit diagrams of the diode 31A according to the present exemplary embodiment are illustrated.

The diode 31A is configured as a back gate-type diode in which the back gate electrode 20 and the drain electrode 13 are connected. This meaning of the term back gate is a gate electrode (the back gate electrode 20) that is disposed at a position that opposes the gate electrode 2, sandwiching the semiconductor layer 8. Because this back gate electrode 20 also operates as a gate electrode, the insulation protection film 17 is formed to serve as an insulation film between the semiconductor layer 8 and the back gate electrode 20. In the present exemplary embodiment, because a bottom gate-type TFT is employed as the diode 31, it can be said that the back gate is equivalent to a top gate electrode (upper electrode). From the above definition of a back gate, in a case of a top gate-type TFT, the back gate would be a lower gate electrode and the same effects as in the present exemplary embodiment can be obtained.

Furthermore, because the diode 31A connects the gate electrode 2 to the adjacent scan line 101, gate signals from the scan line 101 are applied to the gate electrode 2.

In FIG. 8, the diode characteristic when the diode 31A according to the present invention is in the on state is shown by the solid line, and the diode characteristic when the diode 31A is in the off state is shown by the broken line.

At a time of image detection, the scan signal control device 104 sequentially scans signals to input to the scan lines 101. Therefore, at the diode 31A, except when the adjacent scan line 101 to which the diode 31A is connected is on, an off potential (Vg) is applied to the gate electrode 2 through the scan line 101, and the diode 31A is kept in the off state.

Thus, at the diode 31A, when the back gate electrode 20 is held at an off potential, even if a high voltage is applied to the data line 3, only a current of the order of tens of fA flows with a back gate electrode voltage of 20 V or less (see the solid line in FIG. 8).

Therefore, voltages applied to, for example, the two common lines 111A and 111B of the signal detecting circuit 105 are adjusted, and an allowable level of potential difference that causes currents to flow from the data lines 3 to the common lines 111A and 111B, through the protection circuits 112 (the second allowable level), is specified, to be lower than an allowable level of potential difference that causes current to flow from the data lines 3 through the bidirectional diodes 30A to the common line 110 (the first allowable level).

Thus, when the second allowable level is made lower than the first allowable level, namely, the first allowable level is made higher than the second allowable level, if, for example, a voltage of around 60 V is applied to the scan lines 101 by, for example, static electricity or the like, current flows from the data lines 3 through the protection circuits 112 into the common lines 111A and 111B, and is discharged. Therefore, changes in signal values due to leak currents do not occur.

At the time of manufacturing the TFT array, at each bidirectional diode 30B, the gate electrodes 2 of the diodes 31A are connected to the adjacent scan line 101 and the voltage levels are set to 0 V (a free state).

Namely, an off voltage is not applied to the gate electrodes 2 and a current of the order of nA flows even in a state in which the potential difference is 10 V or less. Hence, when, for example, a voltage of around 60 V is applied to the scan line 101 by static electricity or the like, a current of the order of μA flows. Therefore, an insulation film damage effect from static electricity can be reduced.

As described in detail hereabove, according to the present exemplary embodiment, at the time of manufacture of the TFT active matrix substrate 10, static electricity generated in the data lines 3 is discharged into the common line 110 through the bidirectional diodes 30A. Therefore, occurrences of static electricity defects at the time of substrate manufacturing can be prevented. Further, leak currents that are generated in the data lines 3 during driving are discharged into the common lines 111A and 111B through the protection circuits 112. Therefore, changes in signal values due to leak currents during driving can be suppressed.

Further, according to the present exemplary embodiment, when reading out charges that have been accumulated in the charge accumulation capacitance 5, voltages that put the field effect transistors into off states are applied to the field effect transistors configuring the diodes 31A. Thus, because the first allowable level for currents flowing from the data lines 3 through the bidirectional diodes 30A into the common lines 110 is high, changes in signal values due to leak currents during driving can be further suppressed.

Further, according to the present exemplary embodiment, each gate of the field effect transistors configuring the diodes 31A is connected to one of the scan lines 101. Therefore, there is no need for line for controlling the field effect transistors to be separately provided. Here, when a signal that turns on the TFT switches 4 is inputted into a scan line 101, the diodes 31A connected to that scan line 101 may turn on and currents can flow through the diodes 31A. Therefore, it is preferable if the diodes 31A of the bidirectional diodes 30A are connected to, of the plural scan lines 101, the scan line 101 that is disposed furthest to one end.

Artifacts can be generated in image information of the line corresponding to the scan line 101 to which the diodes 31A are connected. Therefore, it is preferable to exclude image information of this line at the signal detecting circuit 105 or the like, and effects on the image as a whole can be suppressed by excluding the image information that is from the line disposed furthest to the one end.

Further, according to the present exemplary embodiment, the scan lines 101 are respectively connected with the common line 110 by the bidirectional diodes 30B. Thus, the gate voltage of each diode 31A of the bidirectional diodes 30A can be kept at around 0 V through the respective scan line 101. Therefore, a state in which currents flow easily can be maintained. Herein, each scan line 101 can be connected with the common line 110 by, instead of the bidirectional diode 30B, a member that has a resistance of at least a predetermined value such as, for example, an amorphous silicon semiconductor layer or the like.

Further, according to the present exemplary embodiment, because the back gates of the field effect transistors of the diodes 31A are formed by the same members as the data lines 3, there is no need to further increase the number of layers for the back gate electrodes.

Further, according to the present exemplary embodiment, because the back gate electrodes 20 of the field effect transistors of the diodes 31A are formed in the same layer as the layer that forms the charge collection electrodes 11, the back gate electrodes 20 can be formed without increasing the number of processes.

Figure 9A:
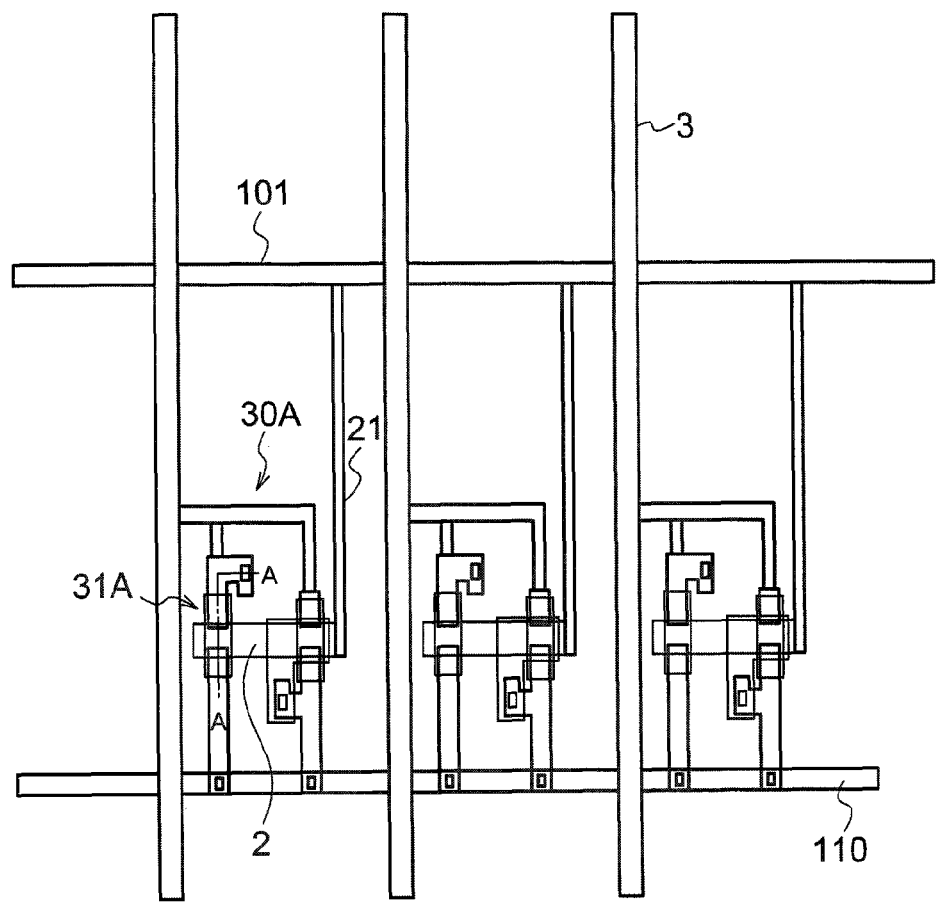
FIG. 9A is a plan diagram illustrating a different configuration of a bidirectional diode according to the exemplary embodiment.
Figure 9B:
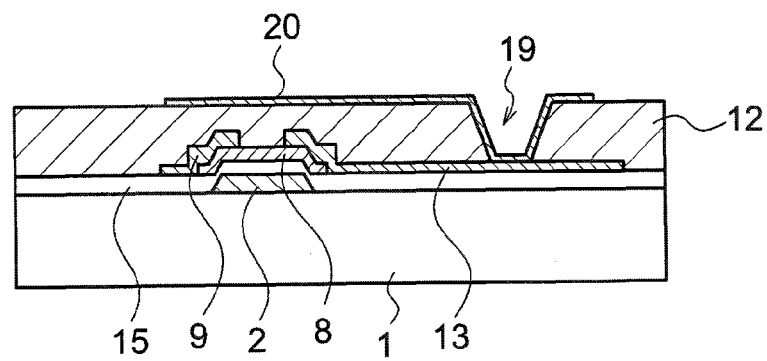
FIG. 9B is a sectional diagram illustrating a section at line A-A of one of the diodes 31A that configure the bidirectional diode illustrated in FIG. 9A.

In the present exemplary embodiment, as illustrated in FIG. 6A and FIG. 6B, for the configuration of the diode 31A portion of the bidirectional diode 30A, a configuration in which the interlayer insulation film 12 is not formed, has been described. However, the present invention is not to be limited thereto. For example, as illustrated in FIG. 9A and FIG. 9B, the interlayer insulation film 12 may be formed in place of the insulation protection film 17, the contact hole 19 being formed in the interlayer insulation film 12, and the back gate electrode 20 being formed over the interlayer insulation film 12 so as to fill in the contact hole 19 and cover the region corresponding to the gate electrode 2, the semiconductor layer 8, the source electrode 9 and the drain electrode 13.

Figure 10:
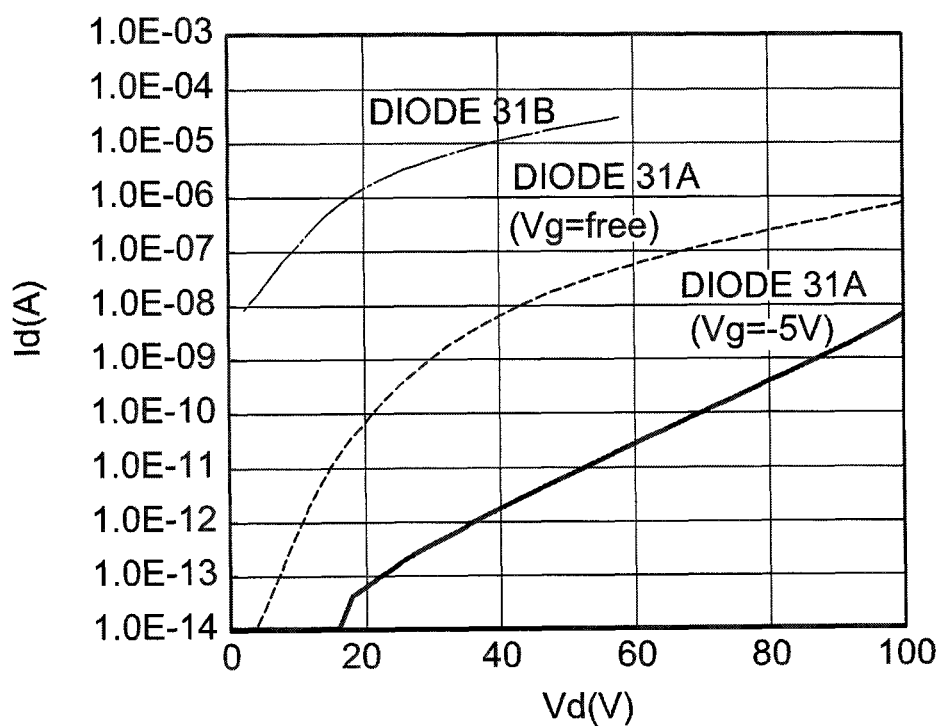
FIG. 10 is a graph illustrating characteristics of the diodes illustrated in FIG. 9A and FIG. 9B according to the exemplary embodiment.
Figure 11:
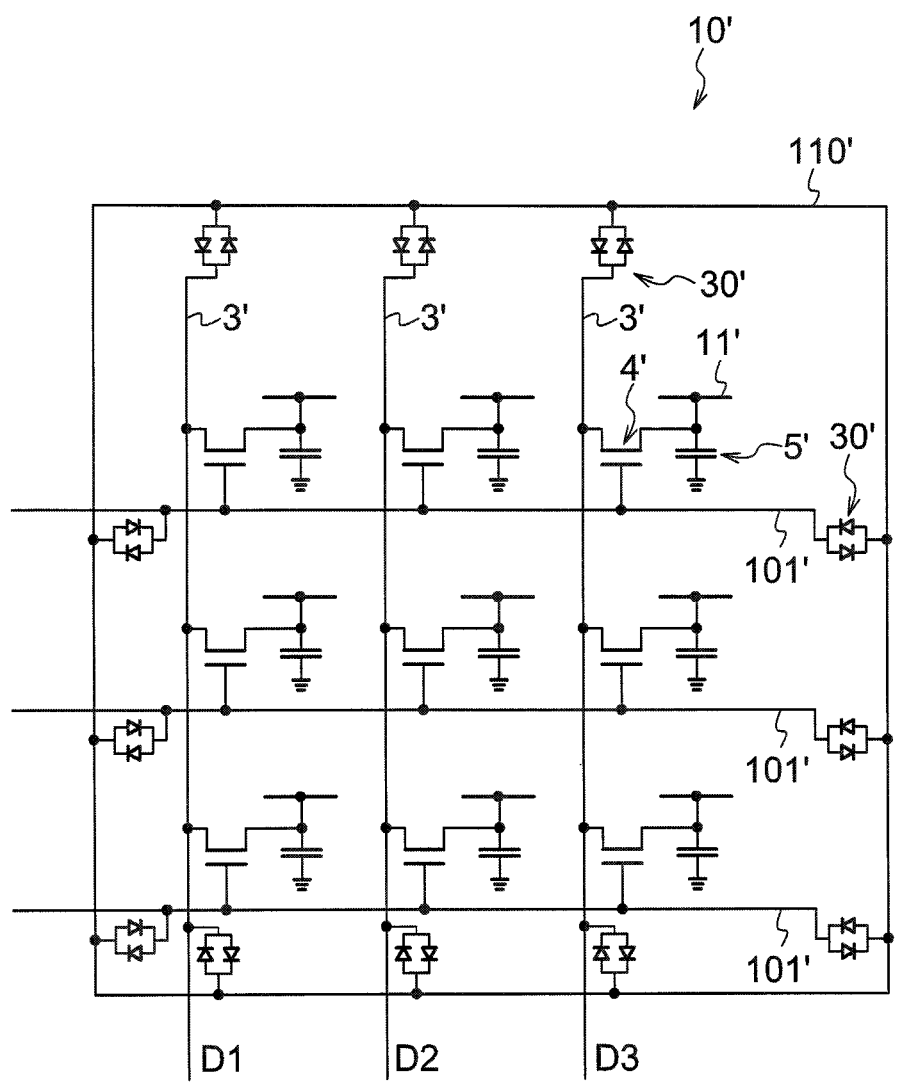
FIG. 11 is a structural diagram illustrating the configuration of a conventional TFT active matrix substrate.

In FIG. 10, a diode characteristic when the diode 31A that is formed in this way is in the on state is shown by the solid line, and a diode characteristic when the diode 31A is in the off state is shown by the broken line. Further, a diode characteristic of the diode 31B is shown by the single-dot chain line. With 60 V when Vg=free, a current of the order of 1 μA flows in FIG. 8, whereas a current of only around 0.1 μA flows in FIG. 10. Therefore, when the configuration of the diode 31A portion of the bidirectional diode 30A has the layer configuration illustrated in FIG. 9, endurance of the TFT active matrix substrate 10 with respect to static electricity defects is lower, but the protection circuits of the present invention may be formed with a common layer configuration, and therefore manufacturing costs of the TFT active matrix substrate 10 can be suppressed.

Further, in the present exemplary embodiment, a case has been described in which the first allowable level is made higher than the second allowable level by using back gate-type diodes in the bidirectional diodes 30A. However, the present invention is not to be limited thereto. For example, the first allowable level may be made higher than the second allowable level by locally altering the impurity density of the semiconductor layer and altering threshold value voltages.

Further, in the present exemplary embodiment, a case has been described in which the present invention is applied to the radiographic image detecting device 100 that detects an image by detecting X-rays, which serve as the electromagnetic waves that are the detection object. However, the present invention is not to be limited thereto. For example, the electromagnetic waves that are the detection object may be any of visible light, ultraviolet light, infrared light and so forth.

In addition, the configuration of the radiographic image detecting device 100 described in the present exemplary embodiment (see FIG. 1) and the configurations of the TFT active matrix substrate 10 (FIG. 2 to FIG. 7, FIG. 9A and FIG. 9B) are examples. It will be clear that suitable modifications are possible within a scope not departing from the spirit of the present invention.

The invention claimed is:
1. An image detecting device comprising:
a substrate including
a plurality of accumulation portions that accumulate charges generated by irradiated electromagnetic waves representing an image which is an object of detection, a plurality of data lines respectively separately connected to the plurality of accumulation portions, a first protection line that protects circuitry from excessive voltage, and a plurality of first protection circuits, respectively separately connected to the plurality of data lines and the first protection line, that allow the current to flow if a potential difference between the data lines and the first protection line is equal to or greater than a predetermined first allowable level; and a detecting circuit, connected to the plurality of data lines, that reads the charges respectively accumulated in the plurality of accumulation portions, and that detects charge amounts to serve as information of pixels configuring the image, including a second protection line that protects circuitry from excessive voltage, and a plurality of second protection circuits, respectively separately connected to the plurality of data lines and the second protection line, that allow the current to flow if a potential difference between the data lines and the second protection line is equal to or greater than a predetermined second allowable level, wherein the plurality of first protection circuits are configured such that the first allowable level is higher than the second allowable level of the second protection circuits.

2. The image detecting device according to claim 1, wherein each first protection circuit is a bidirectional diode configured with two diodes connected in parallel with the anode of each connected to the cathode of the other.

3. The image detecting device according to claim 2, wherein each diode is configured by electrically connecting a gate and a drain of a back gate-type field effect transistor, and the image detecting device further comprises, a voltage application circuit that applies, to the gates of the field effect transistors structuring the plurality of first protection circuits, a voltage that puts the field effect transistors into an off state, when reading the charges accumulated at the accumulation portions.

4. The image detecting device according to claim 3, wherein at the substrate, the plurality of data lines are provided in parallel and the plurality of scan lines are provided in parallel and intersecting the plurality of data lines, the accumulation portions and the field effect transistors that control reading of accumulated charges from the accumulation portions are respectively provided plurally in a two-dimensional arrangement at intersection portions of the data lines and the scan lines, and the field effect transistors are controlled to on and off states by voltages that are respectively applied to the plurality of scan lines, and the gates of the field effect transistors configuring the plurality of first protection circuits are connected to any one of the scan lines.

5. The image detecting device according to claim 4, wherein the gates of the field effect transistors that configure the plurality of first protection circuits are connected to the scan line disposed furthest to one end of the plurality of scan lines provided in parallel.

6. The image detecting device according to claim 4, wherein the plurality of scan lines are each connected to the first protection line by a diode or a member with a resistance value equal to or greater than a predetermined value.

7. The image detecting device according to claim 3, wherein the substrate is a TFT active matrix substrate formed by a plurality of layers being layered, and the back gate electrodes of the field effect transistors of the substrate are disposed at a layer above a semiconductor layer to oppose the gate electrodes, through insulation films.

8. The image detecting device according to claim 7, wherein the back gate electrodes of the field effect transistors of the substrate are formed by the same members as the data lines.

9. The image detecting device according to claim 7, wherein the back gate electrodes are formed in the same layer as a layer that forms charge collection electrodes that collect charges generated at the accumulation portions.

10. The image detecting device according to claim 4, wherein the substrate further includes the first protection line for the scan lines, which is connected to the scan lines, the first protection line for the data lines, which is connected to the data lines, and a third protection circuit that connects the first protection line for the scan lines with the first protection line for the data lines.

* * * * *